(12) United States Patent
Hauf et al.

(10) Patent No.: US 9,665,011 B2
(45) Date of Patent: May 30, 2017

(54) ARRANGEMENT FOR ACTUATING AT LEAST ONE OPTICAL ELEMENT IN AN OPTICAL SYSTEM

(71) Applicant: Carl Zeiss SMT GmbH, Oberkochen (DE)

(72) Inventors: Markus Hauf, Ulm (DE); Alexander Vogler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 160 days.

(21) Appl. No.: 14/670,223

(22) Filed: Mar. 26, 2015

(65) Prior Publication Data

US 2015/0198892 A1 Jul. 16, 2015

Related U.S. Application Data

(63) Continuation of application No. PCT/EP2013/073270, filed on Nov. 7, 2013.
(Continued)

(30) Foreign Application Priority Data

Nov. 29, 2012 (DE) .................. 10 2012 221 831

(51) Int. Cl.
*G03B 27/54* (2006.01)
*G03F 7/20* (2006.01)
(Continued)

(52) U.S. Cl.
CPC ............ *G03F 7/702* (2013.01); *G02B 7/181* (2013.01); *G02B 7/182* (2013.01); *G02B 7/1828* (2013.01);
(Continued)

(58) Field of Classification Search
CPC G02B 26/0816; G02B 26/0833; G02B 7/181; G02B 7/182; G02B 7/1828;
(Continued)

(56) References Cited

U.S. PATENT DOCUMENTS 5,169,050 A 12/1992 Montagu
5,803,609 A 9/1998 Stacklies et al.
(Continued)

FOREIGN PATENT DOCUMENTS

CN 102265219 A 11/2011
DE 10 2008 009 600 A1 8/2009
(Continued)

OTHER PUBLICATIONS

Japanese Office Action, with translation thereof, for JP Appl No. 2015-544401, dated Apr. 22, 2016.
(Continued)

*Primary Examiner* — Peter B Kim
(74) *Attorney, Agent, or Firm* — Fish & Richardson P.C.

(57) ABSTRACT

The invention relates to an arrangement for actuating an element in an optical system, in particular an optical system of a projection exposure apparatus, wherein the optical element is tiltable about at least one tilting axis via at least one joint having a joint stiffness, comprising at least one actuator for exerting a force on the optical element, wherein the actuator has an actuator stiffness which at least partly compensates for the joint stiffness.

29 Claims, 12 Drawing Sheets

Related U.S. Application Data (60) Provisional application No. 61/731,260, filed on Nov. 29, 2012.

(51) Int. Cl.
  G02B 7/182 (2006.01)
  G02B 26/08 (2006.01)
  G02B 7/18 (2006.01)

(52) U.S. Cl.
  CPC ..... G02B 26/0816 (2013.01); G02B 26/0833 (2013.01); G03F 7/70075 (2013.01); G03F 7/70116 (2013.01); G03F 7/70825 (2013.01)

(58) Field of Classification Search
  CPC .. G03F 7/70075; G03F 7/70116; G03F 7/702; G03F 7/70825
  USPC .......................................................... 355/67
  See application file for complete search history.

(56) References Cited

U.S. PATENT DOCUMENTS

| | | | |
|---|---|---|---|
| 6,967,757 | B1* | 11/2005 | Allen ................ G02B 26/0808 359/200.6 |
| 2009/0041182 | A1* | 2/2009 | Endres ................ G03F 7/70075 378/34 |
| 2011/0267596 | A1 | 11/2011 | Muehlberger et al. |
| 2011/0273694 | A1 | 11/2011 | Werber et al. |
| 2012/0044474 | A1 | 2/2012 | Hauf et al. |

FOREIGN PATENT DOCUMENTS

| | | |
|---|---|---|
| EP | 0 831 269 A2 | 3/1998 |
| EP | 1 001 512 A2 | 5/2000 |
| JP | 2012-506135 A | 3/2012 |
| JP | 2012-511821 A | 5/2012 |
| KR | 2011-0070881 | 6/2011 |
| WO | WO2010/049076 | 5/2010 |
| WO | WO 2012/084675 A1 | 6/2012 |
| WO | WO 2012/110406 | 8/2012 |

OTHER PUBLICATIONS

International Preliminary Report on Patentability for corresponding PCT Appl. No. PCT/EP2013/073270, dated Jun. 11, 2015.
C. Ataman et al., "A dual-axis pointing mirror with mobbing-magnet actuation," J of Micromechanics and Microengineering, vol. 23, No. 2, Dec. 21, 2012. http://iopscience.iop.org/articie/10.1088/0960-1317/23/2/025002/meta:jsessionid=925F79F82B960F8DE3FBA3AC2BB9575E.c2.iopscience.cld.iop.org.
Korean Office Action, with translation thereof, for corresponding KR Appl No. 10-2015-7013786, dated Jun. 30, 2016.
German Office Action with English translation thereof, for corresponding Appln. No. DE 10 2012221831.9, dated Jul. 12, 2013.
International Search Report and Written Opinion for corresponding PCT Appl. No. PCT/EP2013/073270, dated May 9, 2014.
Chinese Office Action and Search Report, for translation thereof, for corresponding CN Appl No. 201380058502.3 dated Jul. 27, 2016.

* cited by examiner

ARRANGEMENT FOR ACTUATING AT LEAST ONE OPTICAL ELEMENT IN AN OPTICAL SYSTEM

CROSS REFERENCE TO RELATED APPLICATIONS

This application is a continuation of, and claims benefit under 35 USC 120 to, international application PCT/EP2013/073270, filed Nov. 7, 2013, which claims priority of German Patent Application DE 10 2012 221 831.9 and U.S. 61/731,260, both filed on Nov. 29, 2012. The content of these applications is hereby incorporated by reference.

BACKGROUND OF THE INVENTION

Field of the Invention

The invention relates to an arrangement for actuating at least one optical element in an optical system.

The arrangement according to the invention can advantageously be used in particular in optical systems having a plurality of optical elements that are adjustable independently of one another, for example for actuating a facet mirror in a microlithographic projection exposure apparatus. However, the invention is not restricted thereto, but can generally also be used in other optical systems (for example optical systems for material processing), and in particular such systems in which a plurality of optical elements are mounted in each case adjustably in a confined structural space.

Prior Art

Microlithography is used for producing microstructured components, such as, for example, integrated circuits or LCDs. The microlithography process is carried out in a so-called projection exposure apparatus, having an illumination device and a projection lens. In this case, the image of a mask (=reticle) illuminated via the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

In a projection exposure apparatus designed for EUV (extreme ultraviolet radiation, i.e. electromagnetic radiation having a wavelength of less than 30 nm, in particular less than 15 nm), because of the lack of availability of light-transmissive materials, mirrors are used as optical components for the imaging process. Furthermore, in particular in the illumination device of a microlithographic projection exposure apparatus designed for operation in the EUV, the use of facet mirrors in the form of field facet mirrors and pupil facet mirrors as beam guiding components is known e.g. from DE 10 2008 009 600 A1. Such facet mirrors are constructed from a multiplicity of individual mirrors which are designed to be tiltable via flexures in each case for the purpose of adjustment or else for realizing specific illumination angle distributions. In this case, there is also a need to realize a tilting about two (in particular mutually perpendicular) tilting axes.

One problem that occurs here in practice is that for actuating for instance the individual mirrors of a facet mirror (or for actuating other optical elements in arrangements in which the elements are comparatively closely packed), firstly only a narrowly delimited structural space is available and secondly often—for instance during the operation of the projection exposure apparatus—thermal loads of the actuator also have to be minimized, which results in demanding challenges in respect of the actuator design. This holds true all the more since the flexures used generally have unavoidable bearing stiffnesses which have to be overcome during the actuation of the individual mirrors or optical elements.

SUMMARY OF THE INVENTION

It is an object of the present invention to provide an arrangement for actuating at least one optical element in an optical system which enables an actuation in conjunction with comparatively little required structural space and reduced generation of thermal loads of the actuator.

This object is achieved via an arrangement for actuating at least one optical element in an optical system, wherein the optical element is tiltable about at least one tilting axis via at least one joint having a joint stiffness. The arrangement includes at least one actuator for exerting a force on the optical element, wherein the actuator has an actuator stiffness which at least partly compensates for the joint stiffness.

An arrangement according to the invention for actuating at least one optical element in an optical system, wherein the optical element is tiltable about at least one tilting axis via at least one joint having a joint stiffness, comprises:

at least one actuator for exerting a force on the optical element;

wherein the actuator has an actuator stiffness which at least partly compensates for the joint stiffness.

The invention is based on the concept, in particular, of configuring an actuator such that for the generation of the actuator forces to be exerted on the optical element, from the outset the stiffness of the joint required for tilting is included in the design of the actuator, such that the actuator in any operating position provides precisely the suitable actuator force in a manner already taking account of the joint stiffness.

In particular, the invention includes the concept of taking account of a "positive" joint stiffness via a suitable force-distance characteristic of the actuator, which corresponds to a "negative stiffness", by virtue of the fact that an at least partial (possibly even complete) compensation effect is achieved as a result. In this case, here and hereinafter a system having "negative stiffness" is understood to mean a system which, upon deflection from a predefined central starting position, has a force that increases with increasing deflection and is directed away from the (starting) position. Correspondingly, a system having "positive stiffness" is understood to mean a system in which, with increasing deflection from a predefined central starting position, an increasing force acts in the direction of the central position.

The present invention deliberately departs from conventional approaches which, in the design of an actuator such as e.g. a Lorentz motor, typically strive for force-distance characteristics without stiffnesses (and with actuator force dependent e.g. only on an electric coil current) and as far as possible avoid stiffnesses in the actuator design. Specifically, the invention deliberately chooses, rather, in the actuator design a force-distance characteristic which has negative stiffnesses—conventionally undesired with regard to avoiding instabilities. In this case, the design of the actuator is determined precisely such that a negative stiffness is present in that region of the force-distance characteristic which is relevant during operation for the purpose of achieving the compensation effect described above, the negative stiffness being used for relieving the current-dependent variable force component.

The invention takes account, in particular, of the circumstance that in a construction having an adjustable optical element (such as, for instance, a mirror element of a facet mirror) the actuator no longer works solely against an inertial mass or a constant weight force, rather joint stiffnesses constitute a likewise significant or even dominant load to be overcome by the actuator. Whereas in the first-mentioned case for instance of overcoming a constant weight force by the actuator it is necessary to provide substantially the maximum required actuator force over the entire movement range, the force to be provided by an actuator in the application according to the invention, on account of the joint stiffness taken into account in a targeted manner, is already adapted to the respective current operating position of the actuator or of the joint in a targeted manner.

In accordance with one embodiment, the actuator stiffness and the joint stiffness have mutually opposite signs over a predefined operating range of the actuator.

In accordance with one embodiment, the actuator stiffness and the joint stiffness deviate from one another in terms of absolute value by a maximum of 50 percent, in particular by a maximum of 30 percent, more particularly by a maximum of 10 percent, more particularly by a maximum of 5 percent, and more particularly by a maximum of 1 percent, of the respective value of the actuator stiffness over the predefined operating range of the actuator.

In accordance with one embodiment, the actuator has a rotor, which has at least one magnet, and a stator including a coil to which electric current can be applied. In this case, in particular, a separating layer for vacuum sealing can be provided between rotor and stator.

In accordance with one embodiment, the arrangement has a parallel guide for the optical element, which parallel guide can be constructed e.g. from two leaf spring elements. Preferably, the parallel guide is designed in such a way that it translates a force acting between rotor and stator into a force component parallel to the drive direction of the actuator in such a way that the force component at least partly compensates for the joint stiffness. In this configuration, therefore, the in principle parasitic attractive force action acting between rotor (or the magnets provided on the rotor) and stator (or a soft-iron core associated therewith) can be used in a targeted manner and be translated into an additional force in the shear direction or direction of movement of the rotor in order to make an additional contribution to the negative stiffness of the actuator and thus to overcoming the joint stiffness.

In accordance with one embodiment, the optical element is tiltable about at least two tilting axes, in particular about two mutually perpendicular tilting axes. In this case, the effect achieved by the invention for instance with regard to the effective use of the structural space available only to a limited extent and the avoidance of disturbing energy dissipations is manifested particularly advantageously. However, the invention is not restricted to the drive in two or more degrees of freedom, but rather also encompasses arrangements for the drive in only one degree of freedom.

In accordance with one embodiment, the optical system has a plurality of optical elements, wherein each of the elements is assigned in each case at least one such actuator. In particular, each optical element can be assigned two actuators in order to set two degrees of freedom independently of one another. In this case, the optical elements can be adjustable in particular independently of one another. In such applications having a comparatively dense arrangement of a plurality of optical elements that are actuatable (in particular independently of one another), the invention can be used particularly advantageously with regard to the effective use of the structural space available only to a limited extent and the avoidance of disturbing energy dissipations.

In accordance with one embodiment, the actuators assigned to the optical elements are arranged in at least two, in particular in at least three, different planes.

In accordance with one embodiment, the optical system is a facet mirror, in particular a field facet mirror.

In further embodiments, the concept according to the invention of generating a negative stiffness can also be used in a passive assembly which itself does not exert an actively regulable force on the optical element, but rather is only used passively e.g. for the support of a further assembly (e.g. of a voice coil motor) in order to be able to design the latter to be weaker with regard to the actively regulable force to be generated. Consequently, the present application should be deemed also to encompass arrangements in which the generation of the negative stiffness for compensating for the joint stiffness, on the one hand, and the exertion of the actively regulable force on the optical element, on the other hand, are functionally separated from one another or realized in separate assemblies.

The invention furthermore relates to a projection exposure apparatus comprising an arrangement according to the invention. The projection exposure apparatus can be designed in particular for operation in the EUV.

Further configurations of the invention can be gathered from the description and the dependent claims.

The invention is explained in greater detail below on the basis of exemplary embodiments illustrated in the accompanying drawings.

DETAILED DESCRIPTION OF PREFERRED EMBODIMENTS

Figure 1:
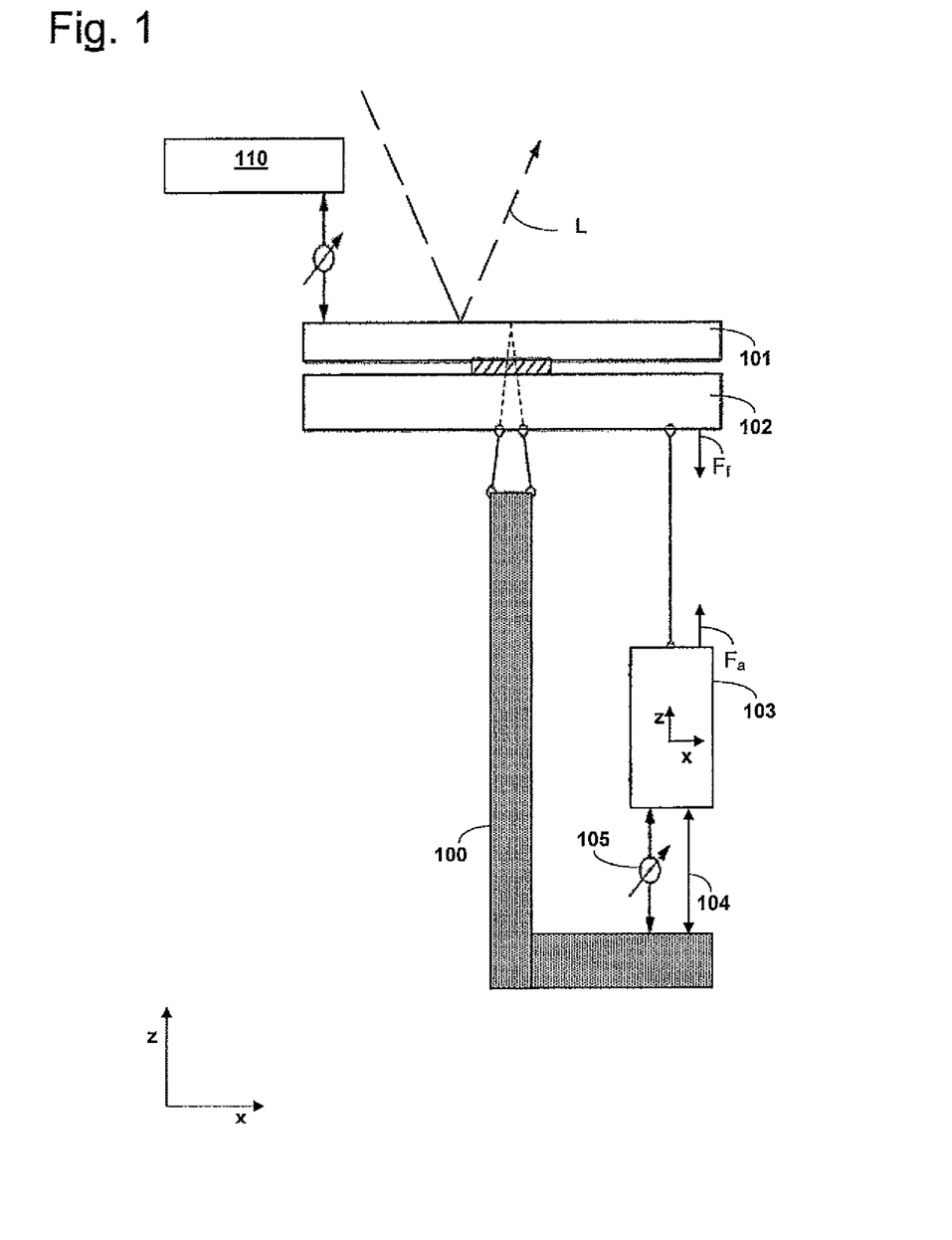
FIGS. 1-3 show schematic illustrations for elucidating the concept according to the invention.

FIG. 1 firstly shows a basic schematic diagram for elucidating the concept underlying the invention.

In accordance with FIG. 1, controllable forces can be applied to an optical element in the form of a mirror facet 101 of a facet mirror via an actuator. The mirror facet 101 is connected to a frame or carrying frame 100 via a joint 102, wherein the joint 102 is driven via a rotor 103 on the basis of the position determination of a (local) sensor 105 and converts the linear movement of the rotor 103 into a rotational movement of the mirror facet 101. "110" designates a global position sensor for measuring the position of the mirror facet 101. $F_t$ designates the force of the joint 102 on the rotor 103. $F_a$ designates the force exerted on the mirror facet 101 by the actuator 104 via the rotor 103.

Figure 2:
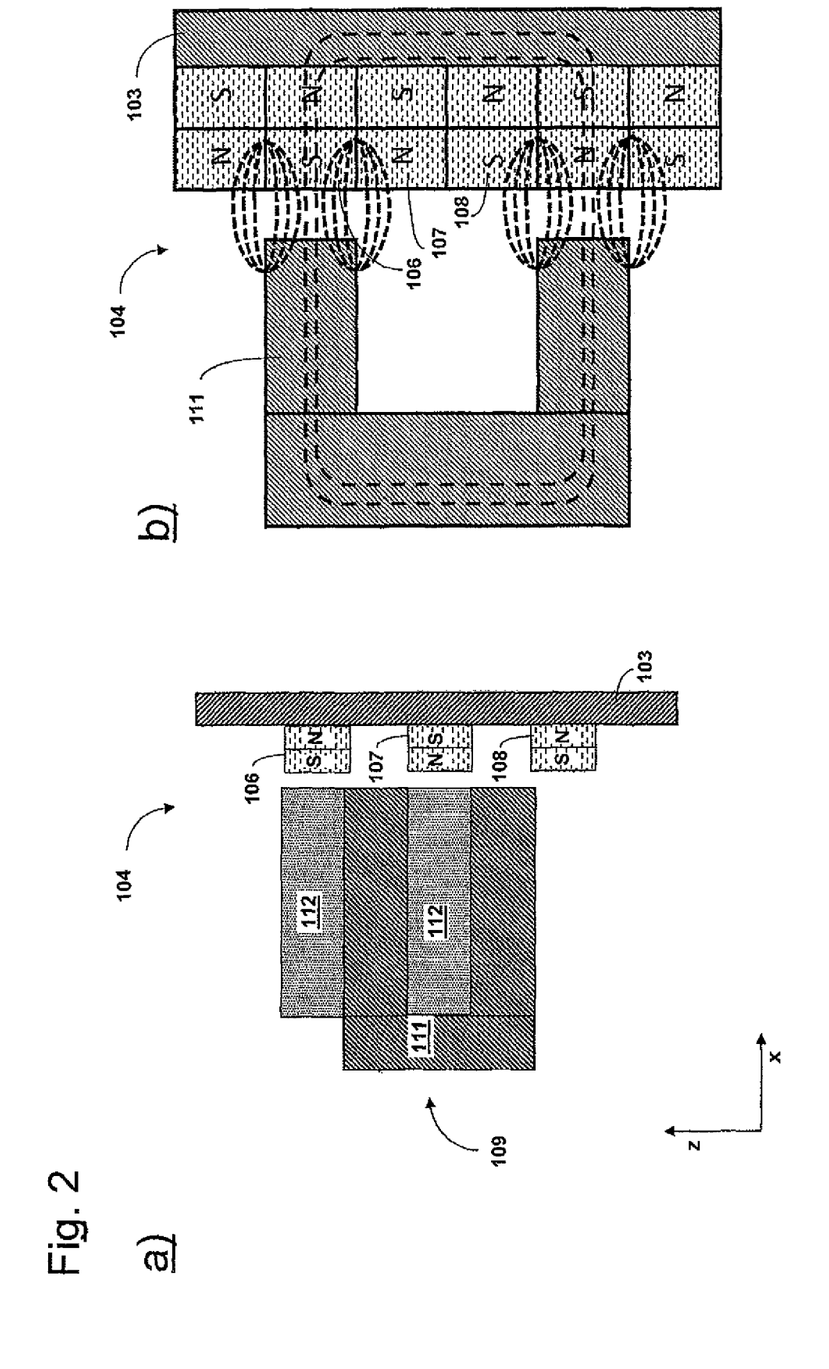

FIG. 2$a,b$ schematically show an embodiment of the actuator 104 according to the invention in the form of a heteropolar motor. In this case, the rotor 103, which performs a linear movement and is provided with magnets 106, 107, 108 mounted in a defined geometry in its outer region, is illustrated alongside a soft-iron core 111, around which is wound a coil 112 to which an electric current can be applied. The coil 112 and soft-iron core 111 form a stator 109 of the motor formed together with the rotor 103. In this case, the static magnetic field (indicated in FIG. 2b) is influenced in a targeted manner by the application of electric current to the coil 112 (omitted in FIG. 2b), wherein the force generated is quadratically dependent on the electric coil current. The initial force generated overall by the actuator 104 results as the sum of a force component that is variably adjustable via the electric coil current and a "passive" (i.e. no longer variable for a given position of the magnets 106-108) force component resulting from the relative position of the magnets 106-108 with respect to the coil 112 (i.e. from the relative position of rotor 103 and stator 109).

Figure 3:
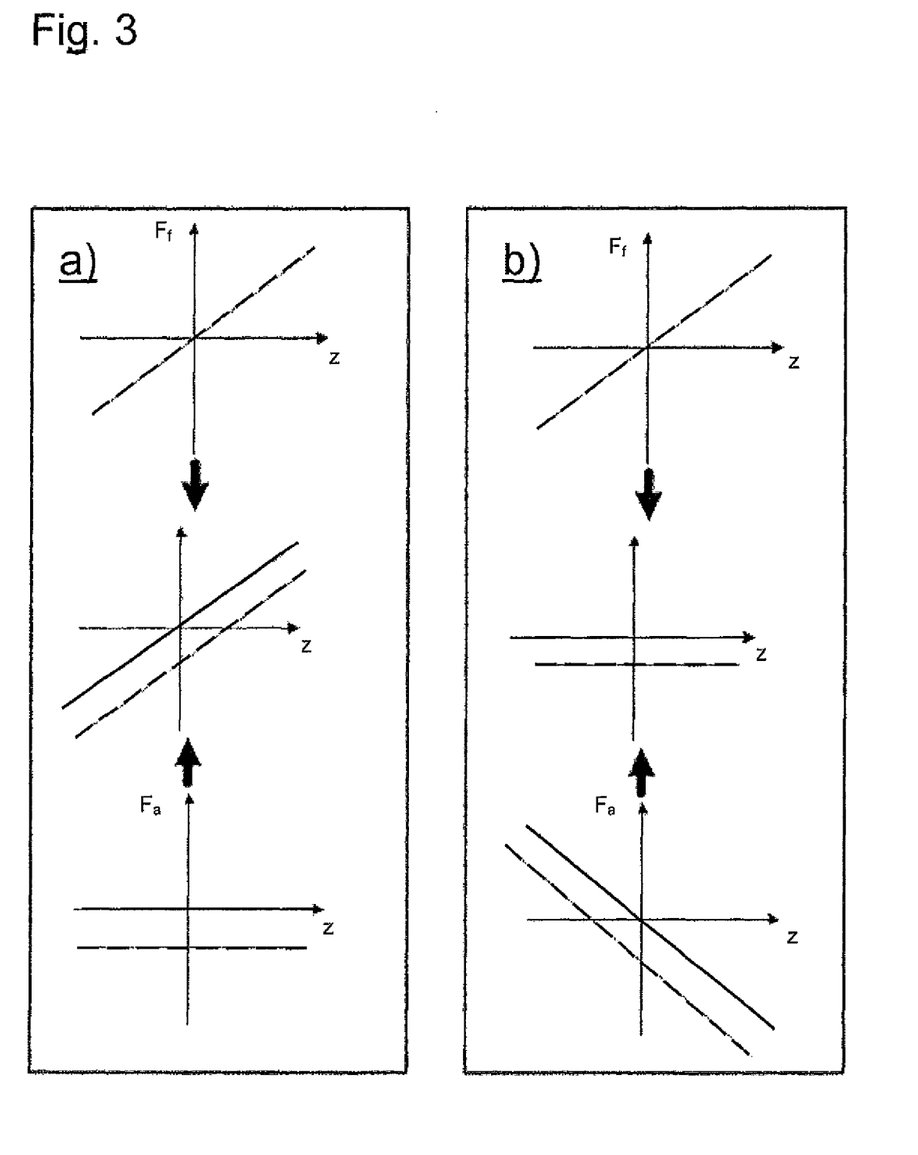

As illustrated in FIG. 3a,b, the force-distance characteristic for the arrangement according to the invention as shown in FIG. 2a,b differs in principle from that of a so-called voice coil actuator or hybrid motor. In this case, the bottom diagram in FIG. 3a shows the exemplary profile of the force-distance characteristic of a voice coil actuator, wherein the z-coordinate here and hereinafter designates the distance coordinate in the drive direction of the actuator. The middle diagram in FIG. 3a shows (as does the middle diagram in FIG. 3b) in each case the force-distance characteristic that results for the overall system comprising actuator and joint, wherein the respective top diagram in FIG. 3a and FIG. 3b shows the force-distance characteristic and the resulting positive stiffness of the joint or spring element 102.

While the force-distance characteristic of a voice coil actuator in accordance with FIG. 3a (bottom diagram) exhibits a constant profile, such that the actuator force is only dependent on the electric coil current, for the construction according to the invention from FIG. 2a,b there already arises on account of the arrangement of the magnets 106-108, even without an electric coil current, a force action which is dependent on the position of the rotor 103 or of the magnets 106-108 situated thereon relative to the iron core 111 enclosed by the coil 112.

This circumstance is now used according to the invention in the construction from FIG. 2a,b via targeted selection of the geometry of the arrangement particularly with regard to the magnets 106-108 in order to design the force-distance characteristic or the stiffness of the actuator in a targeted manner. From the point of view of the actuator 104, the force applied in the force-distance characteristic of the joint 102 as shown in the top diagram of FIG. 3b constitutes a counterforce which the actuator 104 for its part has to oppose with an additional force. As indicated in FIG. 3b, now according to the invention via suitable arrangement of the magnets 106-108 and via a resultant negative stiffness of the actuator 104 (bottom diagram in FIG. 3b), the positive joint stiffness is partly or even completely compensated for, such that the actuator 104 exhibits relative to the joint 102 precisely a force increase in the opposite direction relative to the force-distance characteristic and for the overall system, effectively, system stiffness is no longer present (middle diagram in FIG. 3b).

In other words, the actuator 104 is ideally designed precisely such that in any operating position or over the entire movement range of the rotor 103 or of the joint 102 the actuator applies precisely the actuator force opposite to the (counter)force resulting from the joint stiffness, such that the forces on account of the joint stiffness, on the one hand, and on account of the actuator stiffness, on the other hand, mutually cancel one another out. To a certain extent, therefore, in the case of the invention, into the actuator 104 from the outset a certain force component (namely the "passive" force component resulting from the interaction between the magnets 106-108 provided on the rotor 103, on the one hand, and the soft-iron core 111 associated with the stator 109, on the other hand) independent of the actively controllable force that can be generated via the application of electric current to the coil 112 is suitably designed such that the force component that is ultimately still to be applied by the coil 112 through which current flows is correspondingly low, that is to say that the force component that is actively controllable via the electric current can be reduced and the load on the actuator 104 can be correspondingly relieved since the actuator 104 ultimately only has to apply actuating forces or correct comparatively minor incorrect positionings in order to shift the horizontal force-distance characteristic that results for the overall system comprising actuator 104 and joint 102 in the middle diagram of FIG. 3b vertically in the diagram by corresponding "energization" of the coil 112.

According to the invention, for taking account of the positive stiffness of the joint 102 or spring element (cf. top diagram in FIG. 3b), a negative stiffness of the actuator 104 (cf. bottom diagram in FIG. 3b) is chosen, in fact ideally precisely such that in accordance with the middle diagram in FIG. 3b both stiffnesses mutually compensate for one another, such that the load on the actuator 104 is significantly relieved as a result since the ultimately variable force component in accordance with the application of electric current to the coil 112 can be dimensioned to be significantly smaller. The reduction of the magnitude of the electric current in the coil 112 in turn results in less heat dissipation. If, for instance in a simple numerical example, the (initial) force of the actuator that is to be maximally applied via the joint 102 in the top diagram of FIG. 3b is 6 newtons (N) and a portion thereof of 5 newtons is provided by the above-described negative stiffness of the actuator 104, all that remains is a portion of 1 newton which has to be generated by applying electric current to the coil 112. This saving of force to be applied by the coil 112 has an effect that is all the greater and thus more advantageous since the required power rises as the square of the required force.

Referring to FIG. 2a again, therefore, the actuator 104 is designed such that without application of electric current to the coil 112—and thus solely on the basis of the relative position between stator 109 and rotor 103—a force acts oppositely to that counterforce which is generated by the joint stiffness 102. In this case, the position shown in FIG. 2a corresponds to an unstable position, and the position shown in FIG. 2b corresponds to a stable position of the stator 109 or of the soft-iron core 111 associated therewith relative to the rotor 103 or the magnets 106-108 arranged thereon. Consequently, the (initial) position in FIG. 2a is implemented as an unstable position toward which the stator 109 moves in the positive z-direction relative to the coordinate system depicted.

In the construction according to the invention, that part of the actuator 104 which is actively variable by the application of electric current to the coil 112, on account of the design according to the invention of the passive part of the actuator 104 (in the form of the magnets 106-108 provided on the rotor 103), "sees" preferably only a stiffness-compensated system (or only a system having a very low stiffness), such that the variable actuator force to be applied is also only very low. Consequently, for actuating the optical element the actuator 104 only has to drive the corresponding inertial mass, but no longer sees stiffness or sees at least only comparatively low stiffness. As a result, therefore the electric current required for application to the coil 112 and accordingly also the heat output or waste heat associated therewith are reduced.

On account of the configuration according to the invention, for instance in the top diagram of FIG. 3b in the right-hand part of the force-distance characteristic (i.e. for maximum force F or maximum distance z) around the corresponding point on the force-distance characteristic there is no need for instance for the entire (positive and negative) force range up to the maximum force (which would be disadvantageous both with regard to the very limited structural space and with regard to undesired thermal loads), rather a comparatively small range of force values to be provided around the force-distance characteristic is already sufficient.

Figure 4:
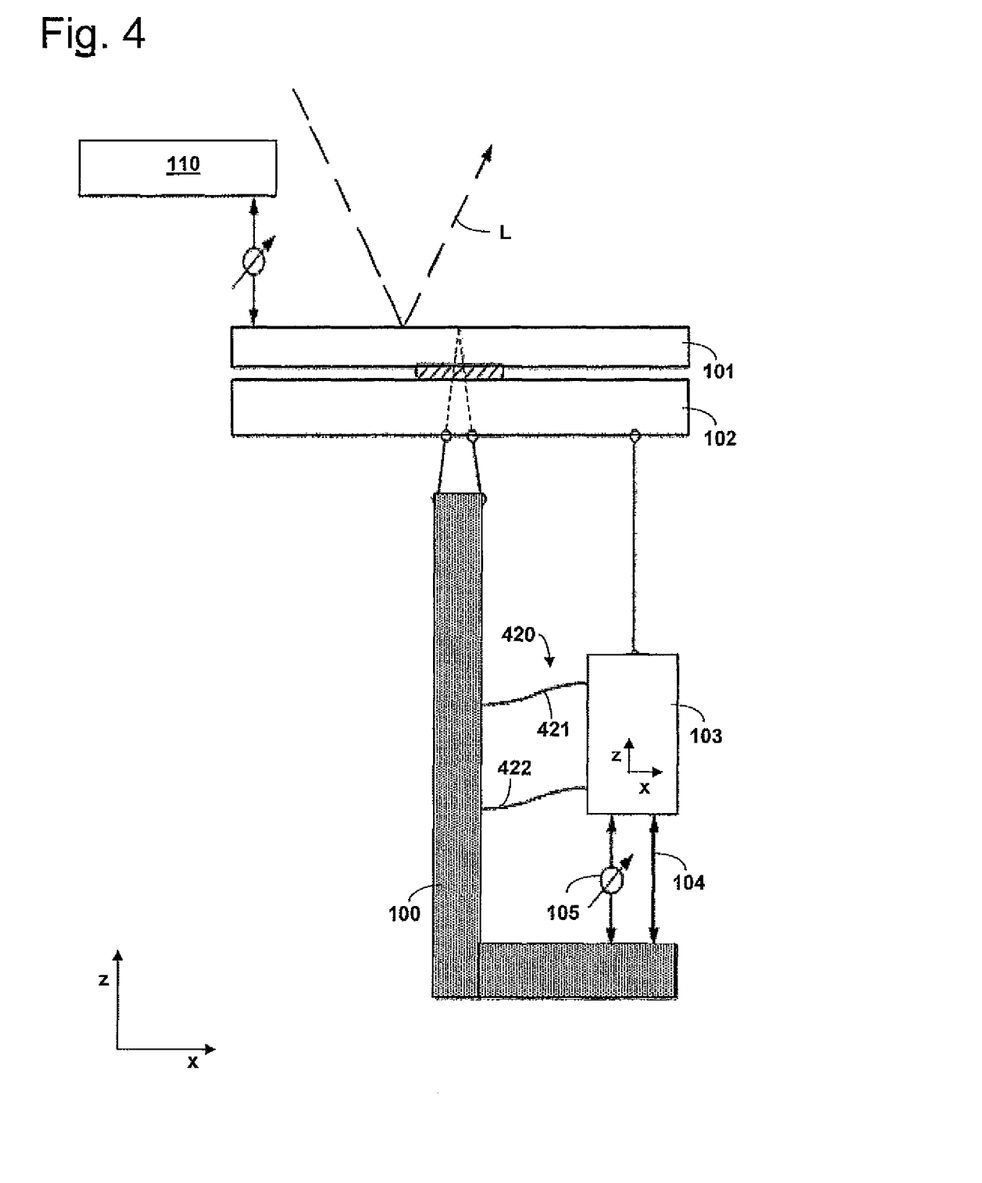
FIGS. 4-5 show schematic illustrations for elucidating the construction and function of a parallel guide which can be used in the arrangement according to the invention.

As described below with reference to FIG. 4,5, the arrangement can have a guide, in particular a parallel guide 420, for the rotor 103. The parallel guide 420 can be realized for example via two leaf springs 421, 422. As a result, the in principle parasitic attractive (normal) force $F_{attr}$ acting between the magnets 106-108 provided on the rotor 103 and the soft-iron core 111 can be used in a targeted manner by virtue of the attractive force $F_{attr}$ being translated via the guide into an additional force in the shear direction or direction of movement of the rotor 103 (corresponding to the z-direction in the coordinate system depicted). In this case, the attractive force $F_{attr}$ (acting in the x-direction in the coordinate system depicted), depending on the design of the actuator 104, can typically amount to a multiple of (e.g. ten times) the shear force acting in the z-direction.

Figure 5:
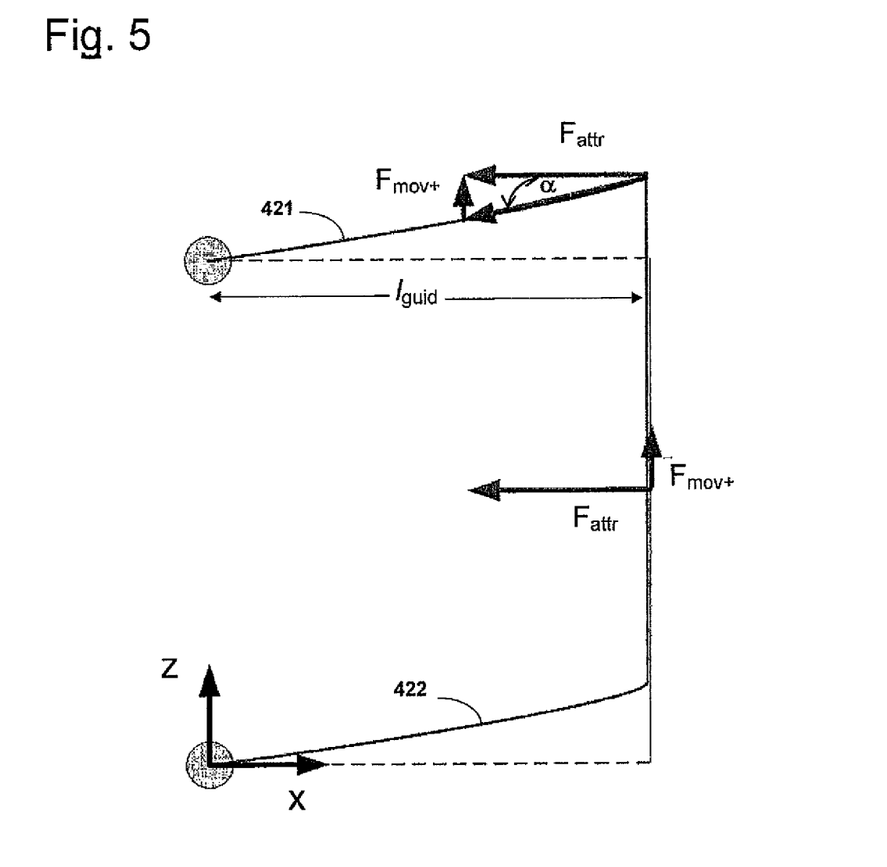

Referring to FIG. 5, the following relationships hold true here:

$$\alpha = \arcsin\left(\frac{z}{l_{guid}}\right) \quad (1)$$

and $$F_{mov+} = \sin(\alpha) \cdot F_{attr} \quad (2)$$

In this case, $l_{guid}$ designates the length of the leaf springs 421, 422 perpendicular to the drive direction of the actuator (i.e. in the x-direction in accordance with FIG. 5). The additional force contribution $F_{mov+}$ in the z-direction which arises in accordance with (2) can, particularly for the comparatively small deflections in the millimeters range in typical applications of the invention (such as the actuation of a facet mirror, for instance), likewise serve for generating the negative stiffness of the actuator 104 and thus for overcoming the joint stiffness.

Figure 6:
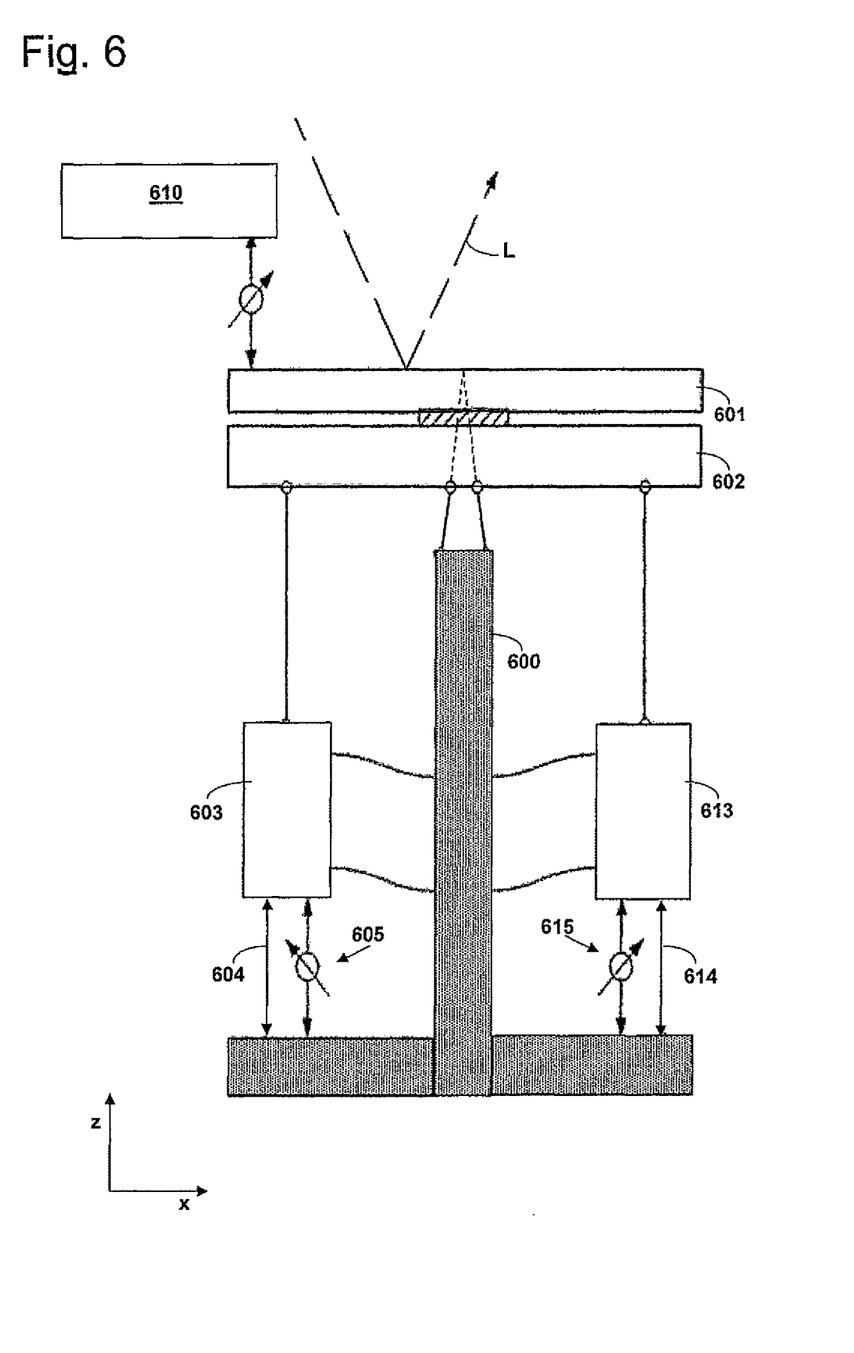
FIGS. 6-11 show schematic illustrations for elucidating further embodiments of the invention.

FIG. 6 serves for elucidating a further embodiment, wherein analogous or substantially functionally identical components in comparison with FIG. 1 are designated by reference numerals increased by "500". In accordance with FIG. 6, not just one actuator but two actuators 604, 614 are provided for actuating an optical element (once again in the form of a mirror facet 601) via two drive axes or in two degrees of freedom. In this case, the effective use of the structural space achieved via the invention and also the minimization of disturbing energy dissipations or thermal loads have an effect all the more since the realization of two actuators for each individual one of the mirror facets is all the more difficult owing to the dense arrangement of the optical elements in a facet mirror.

Figure 7:
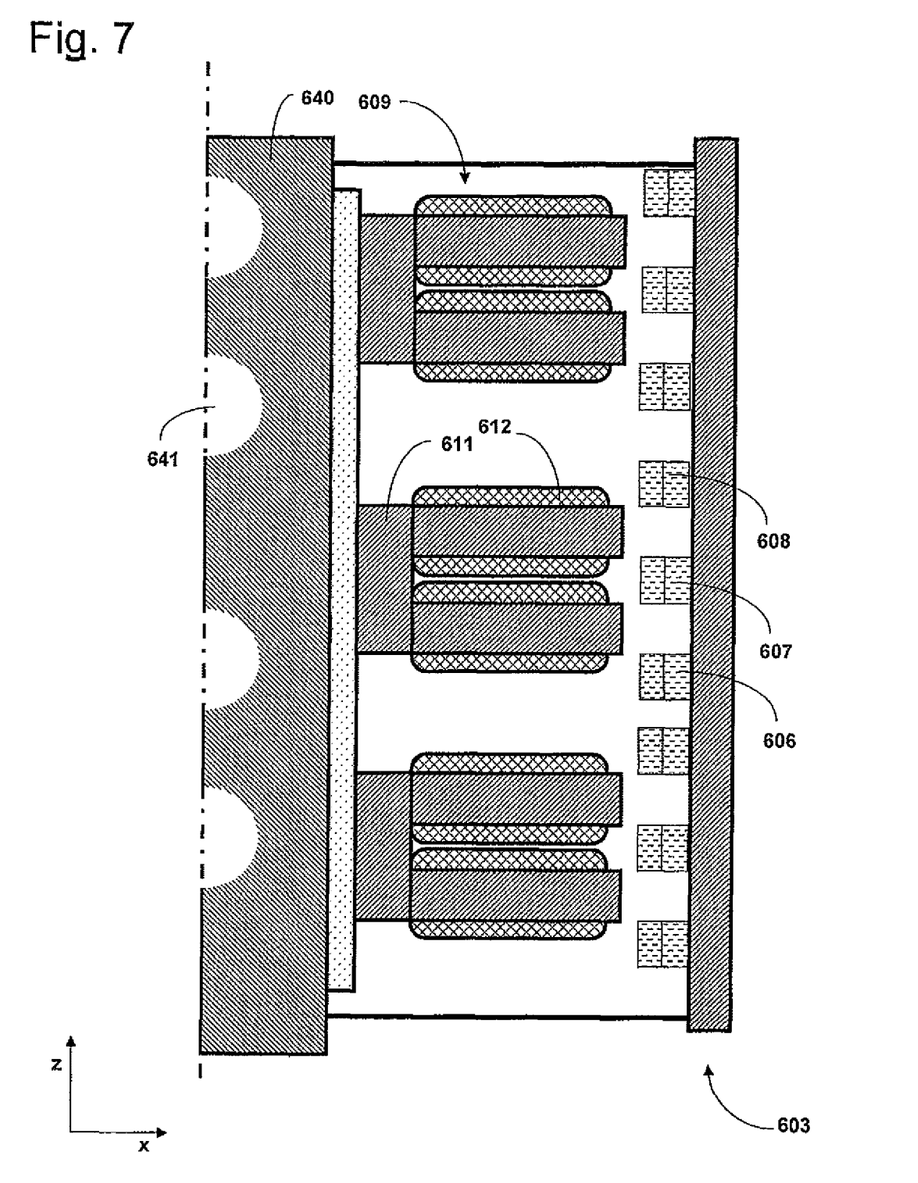

FIG. 7 shows a schematic illustration of an exemplary overall construction having a parallel guide embodied in the manner described above, coils 612 situated in each case on a soft-iron core 611, a seal (not illustrated) between soft-iron core 611 and magnets 606-608 (that is to say between stator 609 and rotor 603), and a heat sink 640 provided with cooling channels 641 through which a cooling liquid such as water, for example, flows. The seal serves for avoiding contaminations particularly in vacuum atmosphere.

Figure 8:
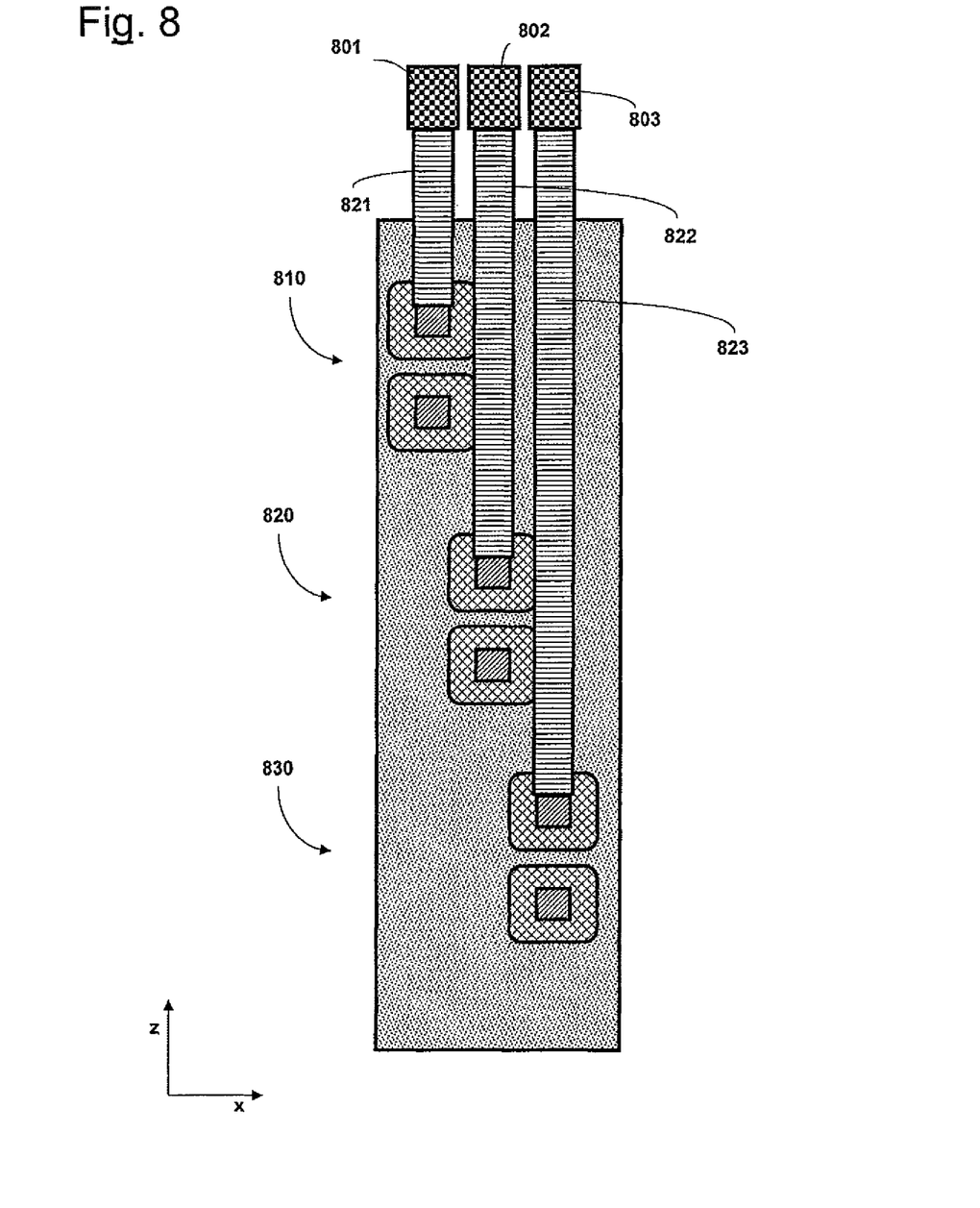

Referring to FIG. 8, an explanation is given below of an embodiment of the invention which further takes account of the distance between the optical components or mirror elements to be actuated, the distance typically being small in an optical system having a plurality of mutually independently adjustable optical elements, such as e.g. a facet mirror, and the resultant structural space limitation for the actuator.

In this case, actuators of the arrangement are arranged in different planes lying one above another, i.e. in other words a stacked arrangement of the actuators is chosen. This configuration is based on the consideration that the force exerted by each individual actuator on the optical element (designated by "801", "802" and "803" in FIG. 8) is linearly dependent on the degree of overlap between the magnets respectively provided on the rotor and the respective soft-iron core of the associated stator in the relevant actuator. Owing to the abovementioned stacked arrangement of the actuators, as can be seen directly from FIG. 8, a larger width perpendicular to the drive direction (i.e. in the x-y plane in FIG. 8) is available for each individual one of the actuators, such that the abovementioned degree of overlap and thus the actuator force are increased in comparison with an arrangement of all the actuators in a single common plane. In this case, as indicated in FIG. 8, the tilting levers 821-823 resulting in each case for the individual planes 810-830 have different length. FIG. 8 shows merely by way of example an arrangement of the actuators in three different planes 810-830, but an arrangement in only two or in four or more planes can also be chosen in further embodiments.

Figure 9:
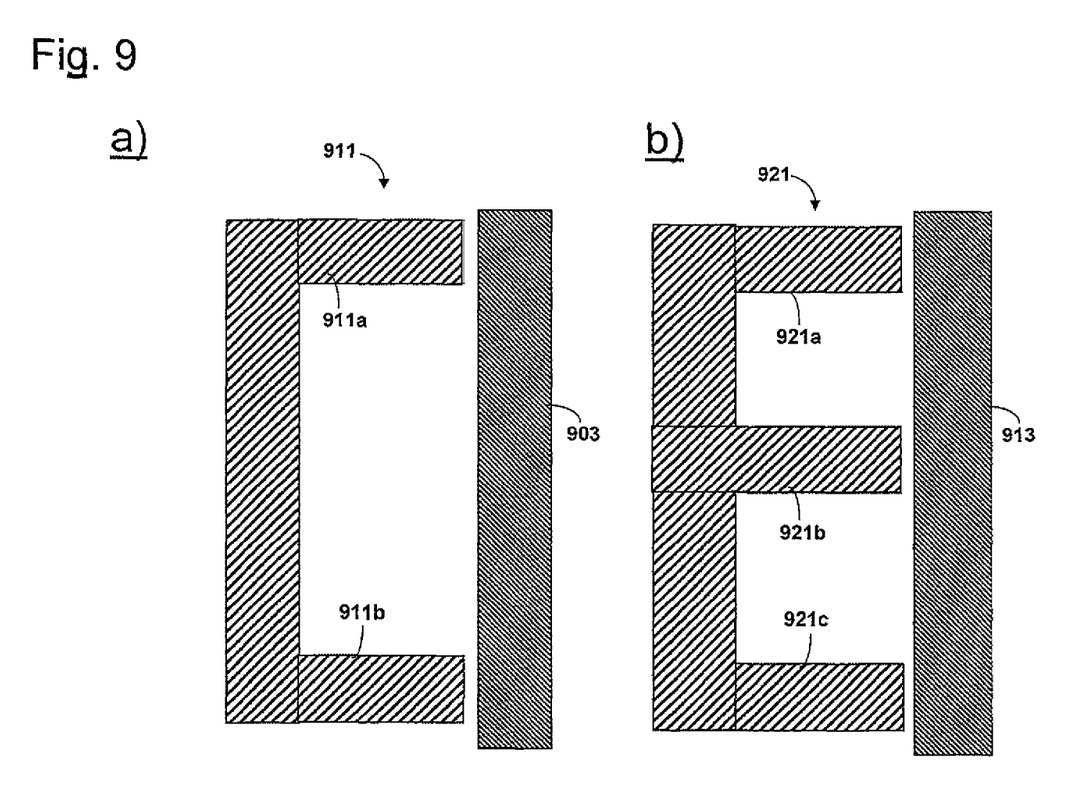
Figure 10:
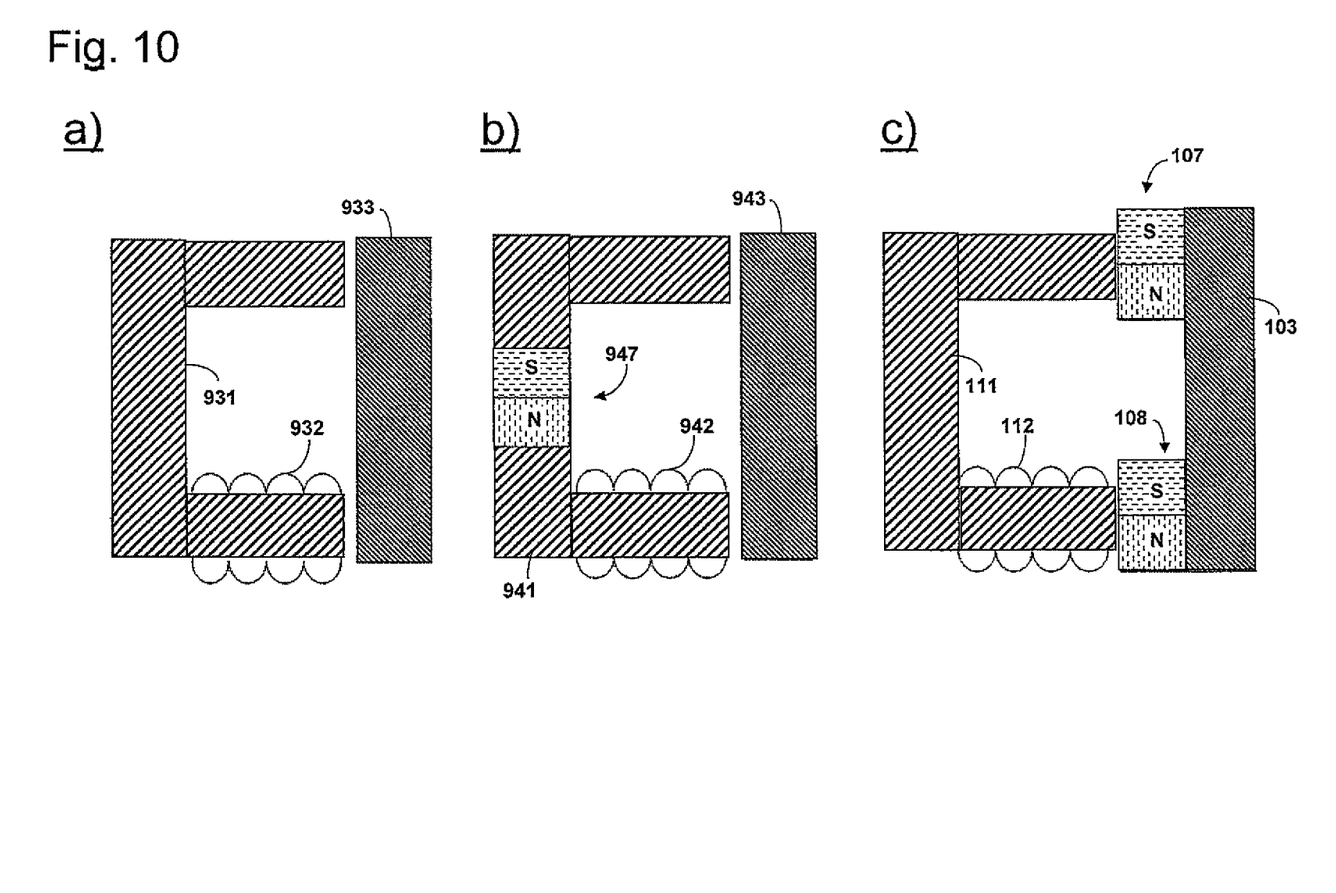
Figure 11:
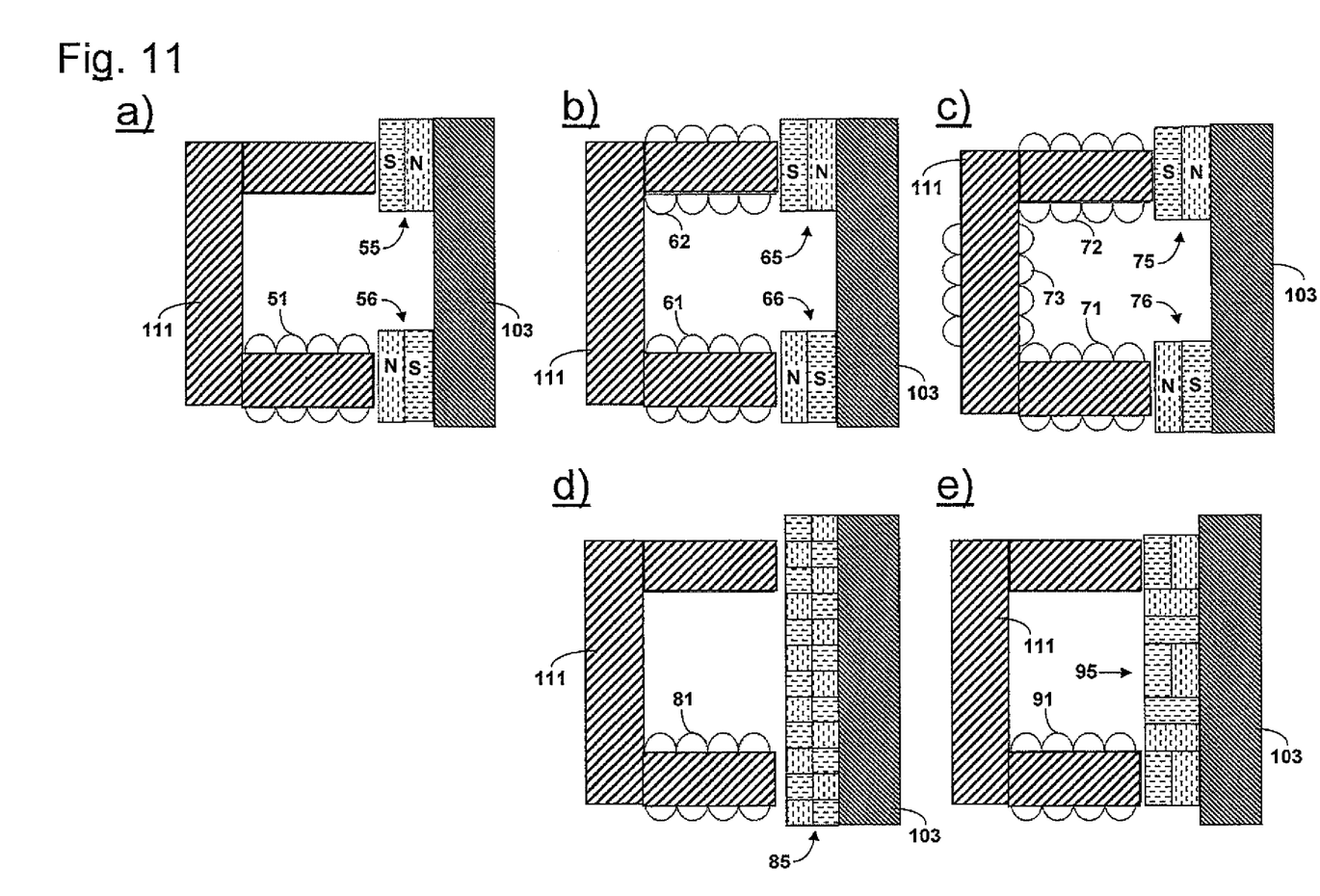

FIG. 9-11 illustrate merely by way of example different embodiments of the invention with regard to possible geometries of rotor and stator.

In this regard, firstly in accordance with FIG. 9a-b the soft-iron core 911 and respectively 921 of the stator (the illustration of the coils situated thereon having been dispensed with) can have a U-shaped geometry ("U-core", FIG. 9a) having two pole limbs 911a, 911b, and also e.g. an E-shaped geometry ("E-core", FIG. 9b) having three pole limbs 921a, 921b, 921c. The rotor is only indicated here and designated by "903" and respectively "913".

FIG. 10a-c show different configurations with regard to the arrangement or geometry of the magnet or magnets provided in a respective actuator. In this case, the geometry underlying the exemplary embodiments described above with reference to FIG. 2 et seq. corresponds to the so-called heteropolar actuator in accordance with FIG. 10c, in which magnets 107, 108 are arranged on the outside of the rotor 103 and in which the concept according to the invention of the "negative stiffness" is realized primarily by the relative arrangement of the magnets 107, 108 with respect to the soft-iron core 111 of the stator, if appropriate and optionally additionally supported by a guide (not illustrated in FIG. 10c) configured as explained with reference to FIG. 4,5.

By contrast, in the case of the configurations as a so-called reluctance actuator in accordance with FIG. 10a, which dispenses with magnets in addition to the soft-iron core 931, or as a so-called hybrid actuator in accordance with FIG. 10b, in which magnets 947 are integrated into the soft-iron core 941, a "negative stiffness" according to the invention is possible only via a guide configured as explained with reference to FIG. 4,5.

FIG. 11a to FIG. 11e show different configurations which differ from one another with regard to the number and/or arrangement of the coils and magnets on the stator and rotor of an actuator according to the invention, wherein different force-distance characteristics for setting or achieving the respectively desired negative stiffness according to the invention can be realized via this variation. Via corresponding selection of the number and arrangement of the coils and/or magnets, it is possible, for instance, to set in a targeted manner a desired (e.g. sinusoidal) profile of the force-distance characteristic or a desired ratio between the force components in the drive direction and in the direction perpendicular thereto ("normal force").

Specifically, FIG. 11a shows an embodiment comprising one coil 51 and two magnets 55, 56, FIG. 11b shows an embodiment comprising two coils 61, 62 and two magnets 65, 66, FIG. 11c shows an embodiment comprising three coils 71, 72, 73 and two magnets 75, 76, FIG. 11d shows an embodiment comprising one coil 81 and a multiplicity 85 of magnets, and FIG. 11e shows an embodiment comprising one coil 91 and a magnet arrangement 95 in the form of a so-called Halbach array (i.e. a construction composed of permanent magnets whose magnetization direction is tilted relative to one another in each case by 90° in the direction of the longitudinal axis of the array).

Figure 12:
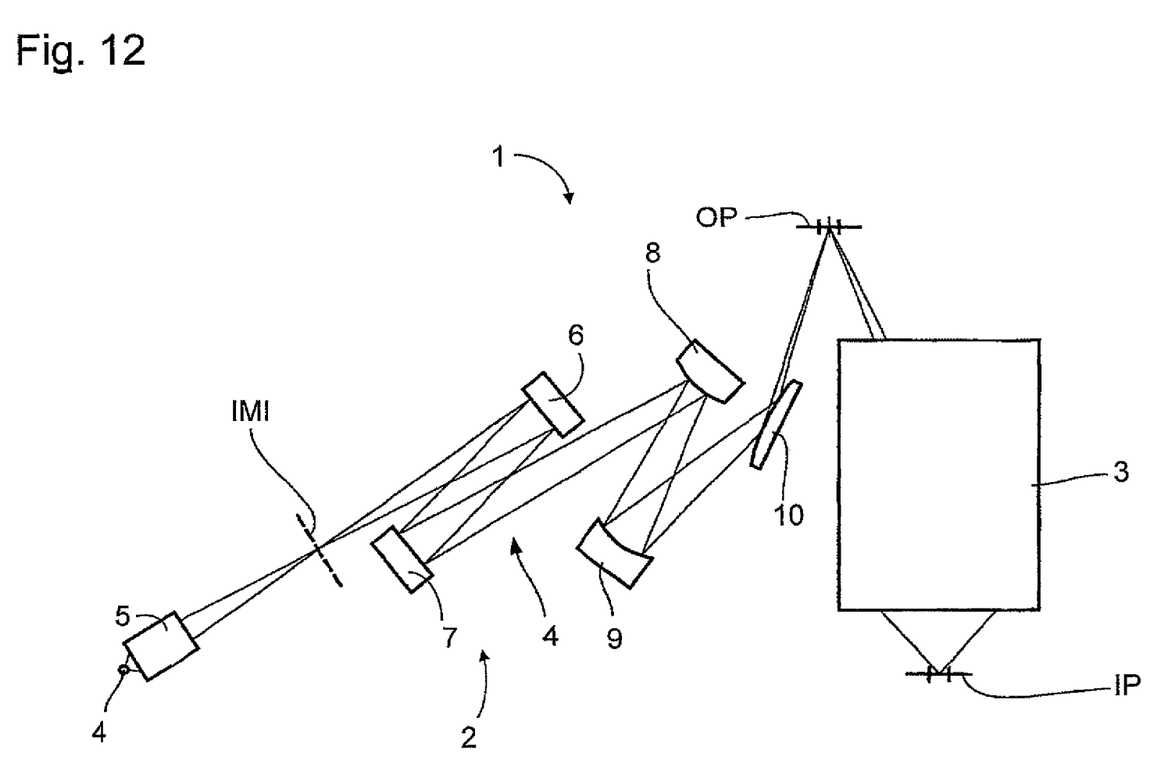
FIG. 12 shows a schematic illustration of a microlithographic projection exposure apparatus designed for operation in the EUV.

FIG. 12 shows merely schematically the construction of a microlithographic projection exposure apparatus which is designed for operation in the EUV and in which the present invention can be realized.

The microlithographic projection exposure apparatus 1 illustrated in FIG. 12 comprises an illumination device 2 and a projection lens 3, wherein the illumination device illuminates an object plane OP of the projection lens 3. The EUV illumination light generated by a plasma radiation source 4 passes via a collector mirror 5 onto an intermediate focal plane IMI and from there via a field facet mirror 6, which can be configured with an arrangement for actuation in accordance with the embodiments described above, onto a pupil facet mirror 7. From the pupil facet mirror 7, the illumination light passes via a transfer optical unit comprising mirrors 8-10 into the object plane OP, in which a mask (reticle) having structures to be imaged is arranged. The mask structures are transferred via the projection lens 3 to the light-sensitive coating of a substrate (wafer) situated in the image plane IP of the projection lens 3.

Even though the invention has been described on the basis of specific embodiments, numerous variations and alternative embodiments are evident to a person skilled in the art, e.g. via combination and/or exchange of features of individual embodiments. Accordingly, it goes without saying for a person skilled in the art that such variations and alternative embodiments are concomitantly encompassed by the present invention, and the scope of the invention is restricted only within the meaning of the accompanying patent claims and the equivalents thereof.

The invention claimed is:

1. An arrangement, comprising:
a joint having a joint stiffness;
an optical element that is tiltable about a tilting axis via the joint; and
an actuator configured to exert a force on the optical element,
wherein the actuator has an actuator stiffness configured to at least partly compensate for the joint stiffness, and the actuator stiffness and the joint stiffness deviate from one another in terms of absolute value by at most 50 percent of the actuator stiffness over the operating range of the actuator.

2. The arrangement of claim 1, wherein the actuator stiffness and the joint stiffness have mutually opposite signs over an operating range of the actuator.

3. The arrangement of claim 1, wherein the actuator stiffness and the joint stiffness deviate from one another in terms of absolute value by at most 30 percent of the actuator stiffness over the operating range of the actuator.

4. The arrangement of claim 1, wherein the actuator stiffness and the joint stiffness deviate from one another in terms of absolute value by at most 10 percent of the actuator stiffness over the operating range of the actuator.

5. The arrangement of claim 1, wherein the actuator stiffness and the joint stiffness deviate from one another in terms of absolute value by at most five percent of the actuator stiffness over the operating range of the actuator.

6. The arrangement of claim 1, wherein the actuator stiffness and the joint stiffness deviate from one another in terms of absolute value by at most one percent of the actuator stiffness over the operating range of the actuator.

7. The arrangement of claim 1, wherein the actuator comprises:
a rotor comprising a magnet; and
a stator comprising a coil configured to have electric current applied thereto during use of the actuator.

8. The arrangement of claim 7, further comprising a separating layer between the rotor and the stator, wherein the separating layer is configured to provide a vacuum seal.

9. The arrangement of claim 8, further comprising a parallel guide for the optical element.

10. The arrangement of claim 9, wherein the parallel guide is configured to translate a force acting between the rotor and the stator into a force component parallel to a drive direction of the actuator so that the force component at least partly compensates for the joint stiffness.

11. The arrangement of claim 9, wherein parallel guide comprises two leaf spring elements.

12. The arrangement of claim 1, further comprising a parallel guide for the optical element.

13. The arrangement of claim 12, wherein parallel guide comprises two leaf spring elements.

14. The arrangement of claim 1, wherein the optical element is tiltable about two tilting axes.

15. The arrangement of claim 1, wherein the optical element is tiltable about two mutually perpendicular tilting axes.

16. The arrangement of claim 1, wherein the optical element comprises a facet mirror.

17. An apparatus, comprising:
an arrangement according to claim 1,
wherein the apparatus is a projection exposure apparatus.

18. The apparatus of claim 17, wherein the apparatus is configured to operate with an operating wavelength of less than 30 nm.

19. The apparatus of claim 17, wherein the apparatus is configured to operate with an operating wavelength of less than 15 nm.

20. An optical system, comprising:
a plurality of optical elements;
a plurality of joints; and
a plurality of actuators,
wherein:
for each of the plurality of optical elements:

the optical element has a corresponding joint and a corresponding actuator;

the optical element is tiltable about a tilting axis via its corresponding joint;

the corresponding actuator is configured to exert a force on the optical element;

the corresponding joint has a joint stiffness;

the corresponding actuator has an actuator stiffness configured to at least partly compensate for the joint stiffness of the corresponding joint; and the actuator stiffness and the joint stiffness deviate from one another in terms of absolute value by at most 50 percent of the actuator stiffness over the operating range of the actuator.

21. The optical system of claim 20, wherein the optical elements are independently adjustable.

22. The optical system of claim 20, wherein the actuators are arranged in two different planes.

23. The optical system of claim 20, wherein the actuators are arranged in three different planes.

24. The optical system of claim 20, wherein an optical element comprises a facet mirror.

25. The optical system of claim 20, wherein an optical element comprises a field facet mirror.

26. The optical system of claim 20, wherein the optical system is an optical system of a microlithographic projection exposure apparatus.

27. An apparatus, comprising:

an optical system according to claim 20, wherein the apparatus is a projection exposure apparatus.

28. The apparatus of claim 27, wherein the apparatus is configured to operate with an operating wavelength of less than 30 nm.

29. The apparatus of claim 27, wherein the apparatus is configured to operate with an operating wavelength of less than 15 nm.

* * * * *

UNITED STATES PATENT AND TRADEMARK OFFICE
CERTIFICATE OF CORRECTION

PATENT NO. : 9,665,011 B2
APPLICATION NO. : 14/670223
DATED : May 30, 2017
INVENTOR(S) : Markus Hauf and Alexander Vogler It is certified that error appears in the above-identified patent and that said Letters Patent is hereby corrected as shown below:

On the Title Page

Page 2, Column 2, item (56) Line 5 under "OTHER PUBLICATIONS", delete "articie" and insert -- article --.

In the Specification

Column 7, Line 16, delete "FIG. 4,5," and insert -- FIGS. 4 and 5, --.

Column 8, Line 39, delete "FIG." and insert -- FIGS. --.

Column 8, Line 42, delete "FIG." and insert -- FIGS. --.

Column 8, Line 50, delete "FIG." and insert -- FIGS. --.

Column 8, Line 62, delete "FIG. 4,5." and insert -- FIGS. 4 and 5. --.

Column 9, Line 3, delete "FIG. 4,5." and insert -- FIGS. 4 and 5. --.

Signed and Sealed this
Fifteenth Day of August, 2017

Joseph Matal
Performing the Functions and Duties of the
Under Secretary of Commerce for Intellectual Property and
Director of the United States Patent and Trademark Office